United States Patent
Adams et al.

(10) Patent No.: US 9,785,373 B2
(45) Date of Patent: Oct. 10, 2017

(54) OPTIMIZING FINE GRAINED CONTEXT ADDRESSABILITY IN HIGHLY DIMENSIONAL ENVIRONMENTS USING TCAM HYBRID MEMORY AND STORAGE ARCHITECTURES

(71) Applicant: INTERNATIONAL BUSINESS MACHINES CORPORATION, Armonk, NY (US)

(72) Inventors: Samuel S. Adams, Rutherfordton, NC (US); Suparna Bhattacharya, Bangalore (IN); Robert R. Friedlander, Southbury, CT (US); James R. Kraemer, Santa Fe, NM (US)

(73) Assignee: International Business Machines Corporation, Armonk, NY (US)

( * ) Notice: Subject to any disclaimer, the term of this patent is extended or adjusted under 35 U.S.C. 154(b) by 126 days.

(21) Appl. No.: 14/951,584

(22) Filed: Nov. 25, 2015

(65) Prior Publication Data
US 2017/0147254 A1 May 25, 2017

(51) Int. Cl.
*G06F 3/06* (2006.01)
*G06F 12/0802* (2016.01)

(52) U.S. Cl.
CPC .......... *G06F 3/0638* (2013.01); *G06F 3/0604* (2013.01); *G06F 3/0655* (2013.01);
(Continued)

(58) Field of Classification Search
CPC .... G06F 3/0638; G06F 3/0604; G06F 3/0655; G06F 3/0685; G06F 12/0802
See application file for complete search history.

(56) References Cited

U.S. PATENT DOCUMENTS

2005/0262294 A1* 11/2005 Bitar ...................... G11C 15/00
711/108
2014/0129767 A1 5/2014 Ramanujan et al.
(Continued)

OTHER PUBLICATIONS

Ed Spitznagel, Packet Classification Using Extended TCAMs, 2003, IEEE.*

(Continued)

*Primary Examiner* — Ryan Bertram
(74) *Attorney, Agent, or Firm* — Law Office of Jim Boice

(57) ABSTRACT

A method, system, and/or computer program product stores and retrieves payload data using a ternary content addressed memory (TCAM) hybrid memory. TCAM data is transmitted to a context masking device. The TCAM data identifies a type of payload data, and the context masking device masks the TCAM data with a context mask to create a masked TCAM data. One or more processors append the masked TCAM to payload data to create multiple stored units of TCAM-identified payload data in a location addressable store (LAS). The processor(s) receive a request for data. The request includes a masked request TCAM data that identifies a content and context of requested data. An exclusive OR (XOR) chip identifies relevant payload data within the LAS that are within a predefined Hamming distance of the masked request TCAM data. The processor(s) return the relevant payload data within the LAS to the requester.

20 Claims, 10 Drawing Sheets

(52) U.S. Cl.
CPC ........ *G06F 3/0685* (2013.01); *G06F 12/0802* (2013.01); *G06F 2212/60* (2013.01)

(56) References Cited

U.S. PATENT DOCUMENTS

| | | | | |
|---|---|---|---|---|
| 2014/0185348 A1* | 7/2014 | Vattikonda | ............. | G11C 15/00 365/49.17 |
| 2015/0019563 A1* | 1/2015 | Wildman | .......... | G06F 17/30982 707/747 |
| 2015/0200011 A1 | 7/2015 | Arsovski | | |

OTHER PUBLICATIONS

P. Mell et al., "The Nist Definition of Cloud Computing", National Institute of Standards and Technology, Information Technology Laboratory, Sep. 2011, pp. 1-7.

Suparna Bhattacharya, Virtually Cool Ternary Content Addressable Memory, Proceedings of the 13th USENIX conference on Hot topics in operating systems, May 9, 2011, USENIX Association Berkeley, CA, USA.

U.S. Appl. No. 13/896,506, filed May 17, 2013.
U.S. Appl. No. 13/896,461, filed May 17, 2013.

\* cited by examiner

OPTIMIZING FINE GRAINED CONTEXT ADDRESSABILITY IN HIGHLY DIMENSIONAL ENVIRONMENTS USING TCAM HYBRID MEMORY AND STORAGE ARCHITECTURES

BACKGROUND

The present disclosure relates to the field of computers, and specifically to the use of computers to store data. Still more particularly, the present disclosure relates to analyzing and/or evaluating and/or retrieving stored data.

Data storage includes the storage of data that describes a particular event, entity, etc. For example, data may describe attributes of a person, place or thing, and/or data may provide details about a commercial transaction (e.g., number of items of a particular type sold at a certain store, the costs of the items, etc.). Such data is stored in a memory structure known as a database, which may be physical or virtual.

SUMMARY

A method, system, and/or computer program product stores and retrieves payload data using a ternary content addressed memory (TCAM) hybrid memory. TCAM data is transmitted from a level 2 ternary content addressable store (L2-TCAS) to a context masking device. The TCAM data identifies a type of payload data. The context masking device masks the TCAM data with a context mask to create a masked TCAM data. The context mask identifies a context in which the type of payload data is used, and the masked TCAM data identifies both the type of payload data and the context in which the type of payload data is used. One or more processors append the masked TCAM to one or more units of payload data to create multiple stored units of TCAM-identified payload data in a location addressable store (LAS). The processor(s) receive a request for data. The request includes a masked request TCAM data that identifies a content and context of requested data. An exclusive OR (XOR) chip identifies relevant payload data within the LAS, where the relevant payload data are appended to masked TCAM data that are within a predefined Hamming distance from the masked request TCAM. The processor(s) return the relevant payload data within the LAS to the requester.

DETAILED DESCRIPTION

Figure 1:
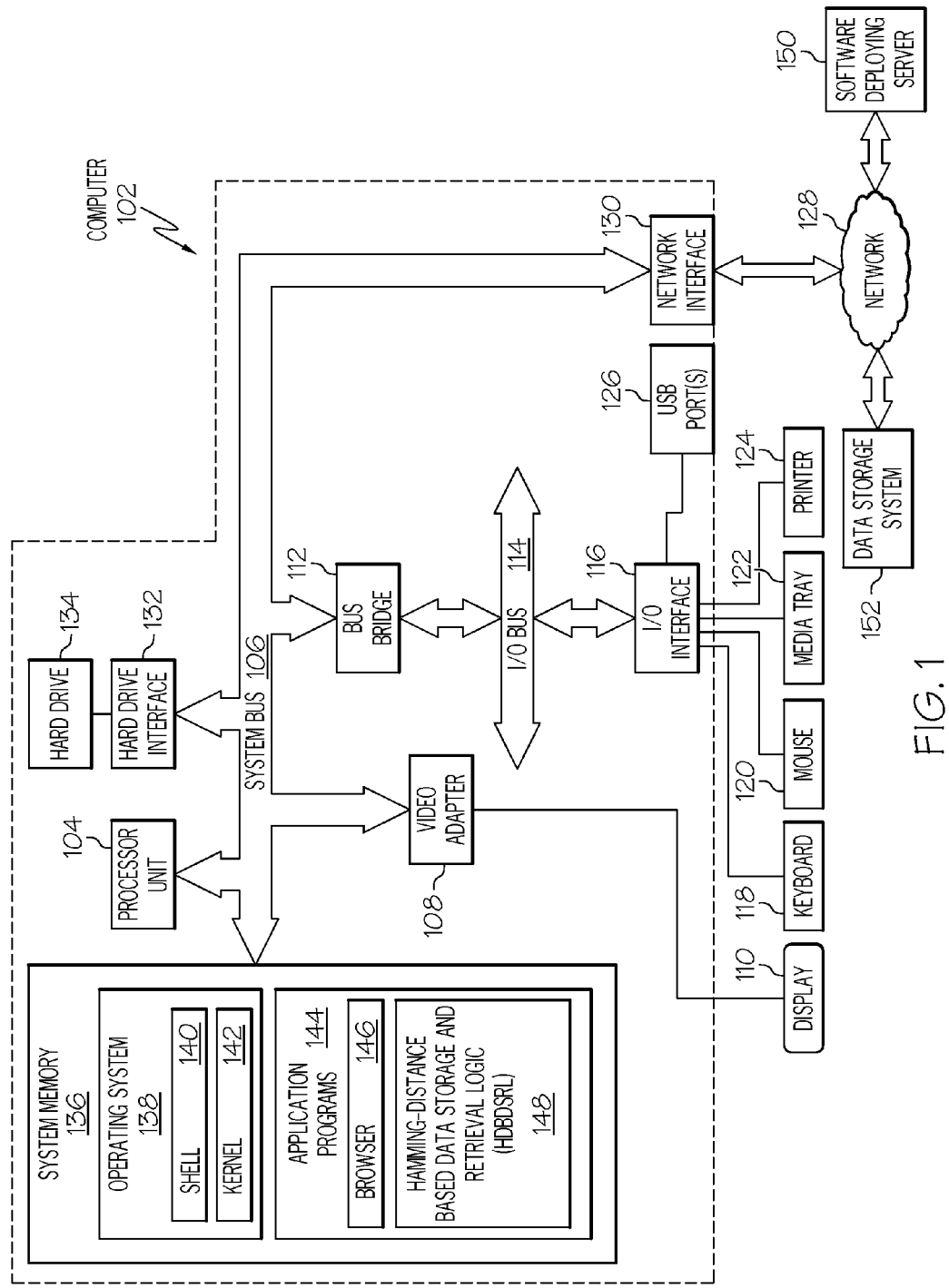
FIG. 1 depicts an exemplary system and network in which the present disclosure may be implemented.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including, but not limited to, wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the present invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

With reference now to the figures, and in particular to FIG. 1, there is depicted a block diagram of an exemplary system and network that may be utilized by and in the implementation of the present invention. Note that some or all of the exemplary architecture, including both depicted hardware and software, shown for and within computer 102 may be utilized by software deploying server 150 and/or a data storage system 152.

Exemplary computer 102 includes a processor 104 that is coupled to a system bus 106. Processor 104 may utilize one or more processors, each of which has one or more processor cores. A video adapter 108, which drives/supports a display 110, is also coupled to system bus 106. System bus 106 is coupled via a bus bridge 112 to an input/output (I/O) bus 114. An I/O interface 116 is coupled to I/O bus 114. I/O interface 116 affords communication with various I/O devices, including a keyboard 118, a mouse 120, a media tray 122 (which may include storage devices such as CD-ROM drives, multi-media interfaces, etc.), a printer 124, and external USB port(s) 126. While the format of the ports connected to I/O interface 116 may be any known to those skilled in the art of computer architecture, in one embodiment some or all of these ports are universal serial bus (USB) ports.

As depicted, computer 102 is able to communicate with a software deploying server 150, using a network interface 130. Network interface 130 is a hardware network interface, such as a network interface card (NIC), etc. Network 128 may be an external network such as the Internet, or an internal network such as an Ethernet or a virtual private network (VPN).

A hard drive interface 132 is also coupled to system bus 106. Hard drive interface 132 interfaces with a hard drive 134. In one embodiment, hard drive 134 populates a system memory 136, which is also coupled to system bus 106. System memory is defined as a lowest level of volatile memory in computer 102. This volatile memory includes additional higher levels of volatile memory (not shown), including, but not limited to, cache memory, registers and buffers. Data that populates system memory 136 includes computer 102's operating system (OS) 138 and application programs 144.

OS 138 includes a shell 140, for providing transparent user access to resources such as application programs 144. Generally, shell 140 is a program that provides an interpreter and an interface between the user and the operating system. More specifically, shell 140 executes commands that are entered into a command line user interface or from a file. Thus, shell 140, also called a command processor, is generally the highest level of the operating system software hierarchy and serves as a command interpreter. The shell provides a system prompt, interprets commands entered by keyboard, mouse, or other user input media, and sends the interpreted command(s) to the appropriate lower levels of the operating system (e.g., a kernel 142) for processing. Note that while shell 140 is a text-based, line-oriented user interface, the present invention will equally well support other user interface modes, such as graphical, voice, gestural, etc.

As depicted, OS 138 also includes kernel 142, which includes lower levels of functionality for OS 138, including providing essential services required by other parts of OS 138 and application programs 144, including memory management, process and task management, disk management, and mouse and keyboard management.

Application programs 144 include a renderer, shown in exemplary manner as a browser 146. Browser 146 includes program modules and instructions enabling a world wide web (WWW) client (i.e., computer 102) to send and receive network messages to the Internet using hypertext transfer protocol (HTTP) messaging, thus enabling communication with software deploying server 150 and other computer systems.

Application programs 144 in computer 102's system memory (as well as software deploying server 150's system memory) also include a Hamming-Distance Based Data Storage and Retrieval Logic (HDBDSRL) 148. HDBDSRL 148 includes code for implementing the processes described below, including those described in FIGS. 2-7. In one embodiment, computer 102 is able to download HDBDSRL 148 from software deploying server 150, including in an on-demand basis, wherein the code in HDBDSRL 148 is not downloaded until needed for execution. Note further that, in one embodiment of the present invention, software deploying server 150 performs all of the functions associated with the present invention (including execution of HDBDSRL 148), thus freeing computer 102 from having to use its own internal computing resources to execute HDBDSRL 148.

The data storage system 152 stores a set of data. This data may be for a particular enterprise, a particular project, a particular owner of the data, etc. As described herein, the data is stored using a content address that describes attributes of the payload data.

Note that the hardware elements depicted in computer 102 are not intended to be exhaustive, but rather are representative to highlight essential components required by the present invention. For instance, computer 102 may include alternate memory storage devices such as magnetic cassettes, digital versatile disks (DVDs), Bernoulli cartridges, and the like. These and other variations are intended to be within the spirit and scope of the present invention.

Content Addressable Memory and Ternary Content Addressable Memory

Content addressable memory (CAM) and ternary content addressable memory (TCAM) technologies provide very fast constant time lookups over a reasonably large array of data, typically through some form of parallel match scheme or optimized dedicated comparison circuitry implemented in hardware. Ternary content addressable memories allow entries to be stored so that any bit position can be a "don't care" bit instead of 0 or 1, allowing compact and flexible data representations.

A content addressable memory makes it possible to handle list searches and data translation as embedded functions within a system. The combination of a content addressable memory and a state machine creates an economical controller for real-time processes that perform data look-ups and translations, and data maintenance in sparsely populated tables. For example, an asynchronous transfer mode (ATM) switch must search internal tables that hold the necessary information for each connection that routes through the switch. The index to these tables is the virtual-path identifier (VPI) for the VPI/virtual channel identifier (VCI) combination from the header of an incoming data cell. The switch uses this information to look up the VPI and VCI for the outgoing link, the internal path through the switch to the correct output port, billing rates, traffic-flow parameters, flags for any special functions, etc. A content addressable memory is particularly suited for such an application.

Figure 2:
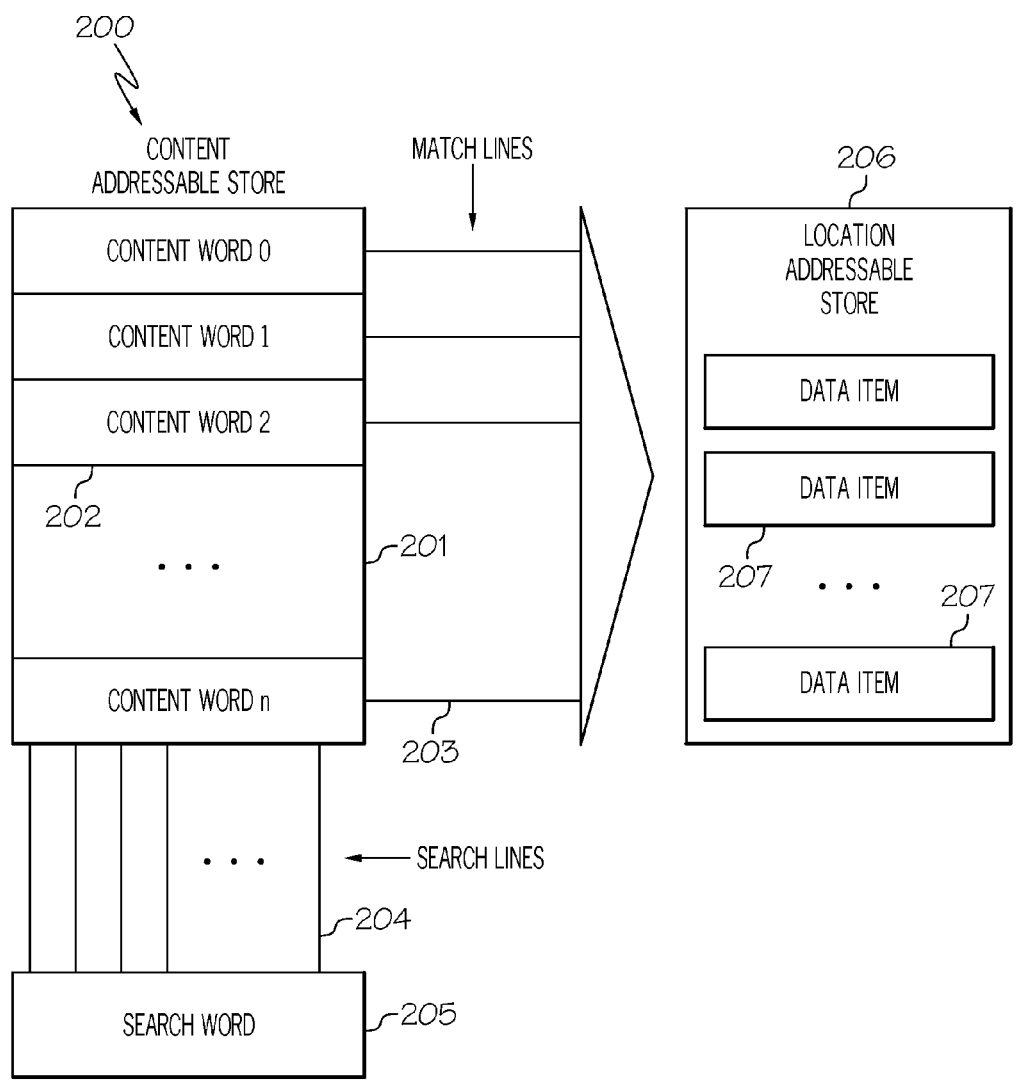
FIG. 2 is a block diagram illustrating an example of a content addressable memory system, in accordance with aspects of the invention.

FIG. 2 illustrates a block diagram of an example embodiment of a content addressable memory system 200, which may be utilized in one or more embodiments of the present invention. The content addressable memory system 200 comprises a content addressable store 201 that contains content words 202. Each content word 202 has a data reference that points to a data item 207 in the location addressable store 206. When a search word 205 needs to be looked up in the memory system 200, the search word 205 is compared to the content words 202 currently in the content addressable store 201 through search lines 204. If the search word 205 is present in the store 201, then data item 207 associated with the search word 205 is identified in the location addressable store 206 through match lines 203, and retrieved accordingly.

The example content addressable memory system 200 enhances existing memory systems and virtual memory models to enable an alternative memory access that disassociates considerations of spatial locality and contiguity from the way data is addressed. This disassociation reduces the system overheads discussed above and effectively provides a fine grained virtual to physical address mapping. A generalized content addressable memory hierarchy, as further described below in the example embodiments of the invention, enables such an address mapping.

Search Map

Figure 3:
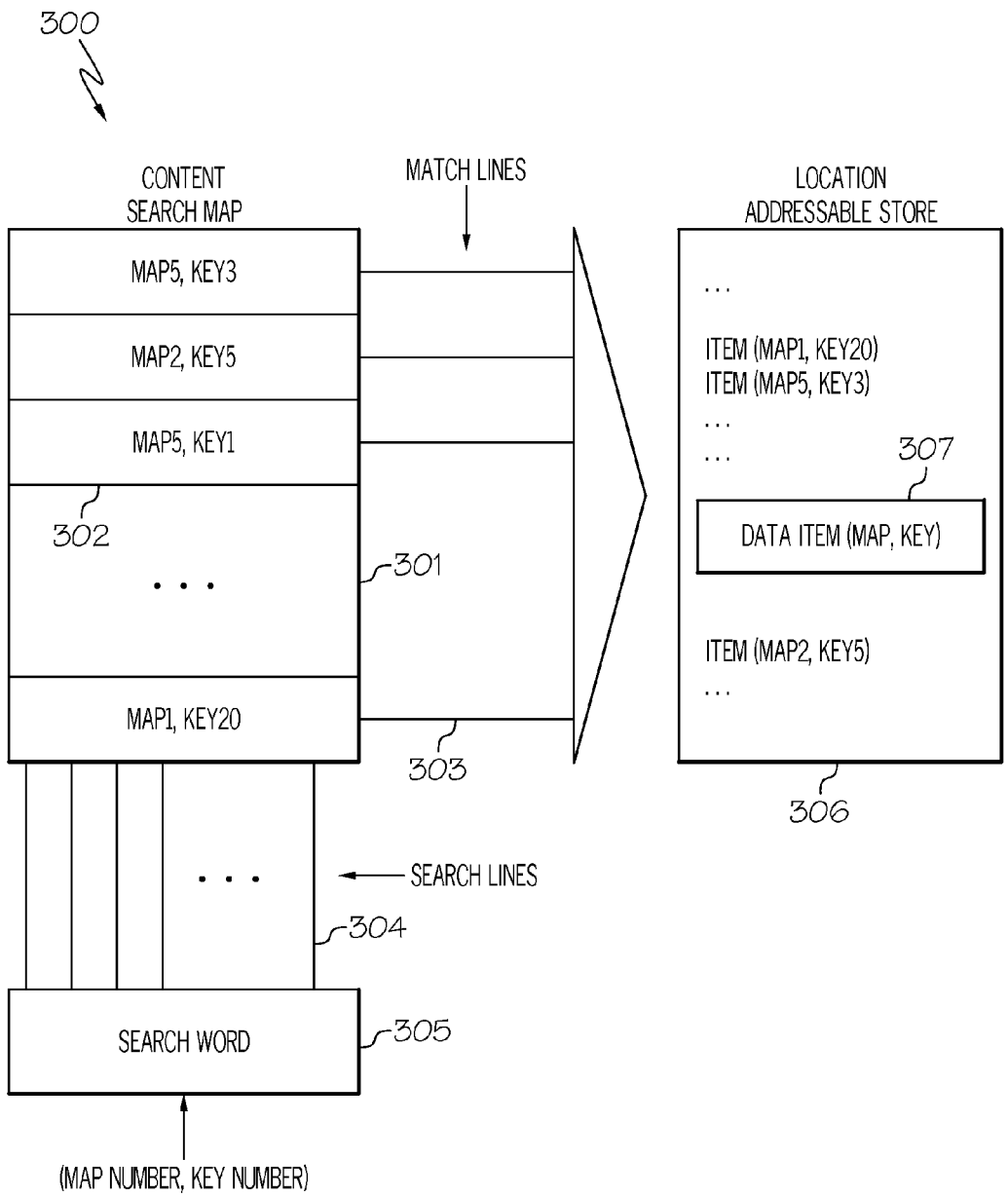
FIG. 3 is a block diagram showing an example of a search map for finding a desired content word in a content addressable memory system, in accordance with aspects of the invention.

FIG. 3 is a block diagram of an example search map 301 for identifying a desired content word in a content addressable memory system 300, and may utilized in one or more embodiments of the present invention. As an example, the search map 301 is based on map-key relationships 302 provided in the content addressable memory stores for finding particular content words. Other search maps may use different relationships associated with the content words to search for the desired content words. Each map-key relationship 302 is associated with a content word 202 in the content addressable store 201. A map-key relationship 302 includes information on a search key, e.g., key 305, for identifying a respective content word 202 in the content addressable memory store 300. When a search word 305 needs to be looked up in the memory system 300, a map-key relationship for the search word 305, similar to the map-key relationships 302, is compared through match lines 304 to the map-key relationships 302 of the map-key table 301. If there is a match between the map-key relationship of the search word 305 and a map-key relationship 302 in the map-key table 310, then the content word 202 associated with the matching map-key relationship 302 is the search word 305 being searched for. Data item 307, which is in the location addressable store 306 and referenced by the matching content word 202, may then be identified through match lines 303 using the data reference of the matching content word.

Content Addressable Store Hierarchy

In the example embodiments of the invention, a content addressable memory store associates ternary content words with corresponding data references. A reference can point to a memory address (and size) in a location addressable store. Other embodiments may provide the relationship between content words and data as inlined data. A content addressable store hierarchy has multiple levels of stores each accommodates a set of content words and typically has certain performance, capacity, and cost attributes. The stores in each level of the content addressable hierarchy map content words to data references. The internal implementation of content addressability may be different at each level of the memory hierarchy. The store levels closer to the processor are referred to as the higher levels, e.g., level 1 is higher than level 2 and closer to the processor than level 2, and level 2 is higher than level 3 and closer to the processor than level 3. In the example embodiments, the higher levels of content based stores generally have better performance at a higher cost, and the levels that are farther away from the processor generally have more capacity and might consume less power per bit. The store levels in the content memory hierarchy may be embodied in hardware or software, or a combination thereof, for achieving the mapping between content words and data references based on performance, capacity, and cost objectives.

Figure 4:
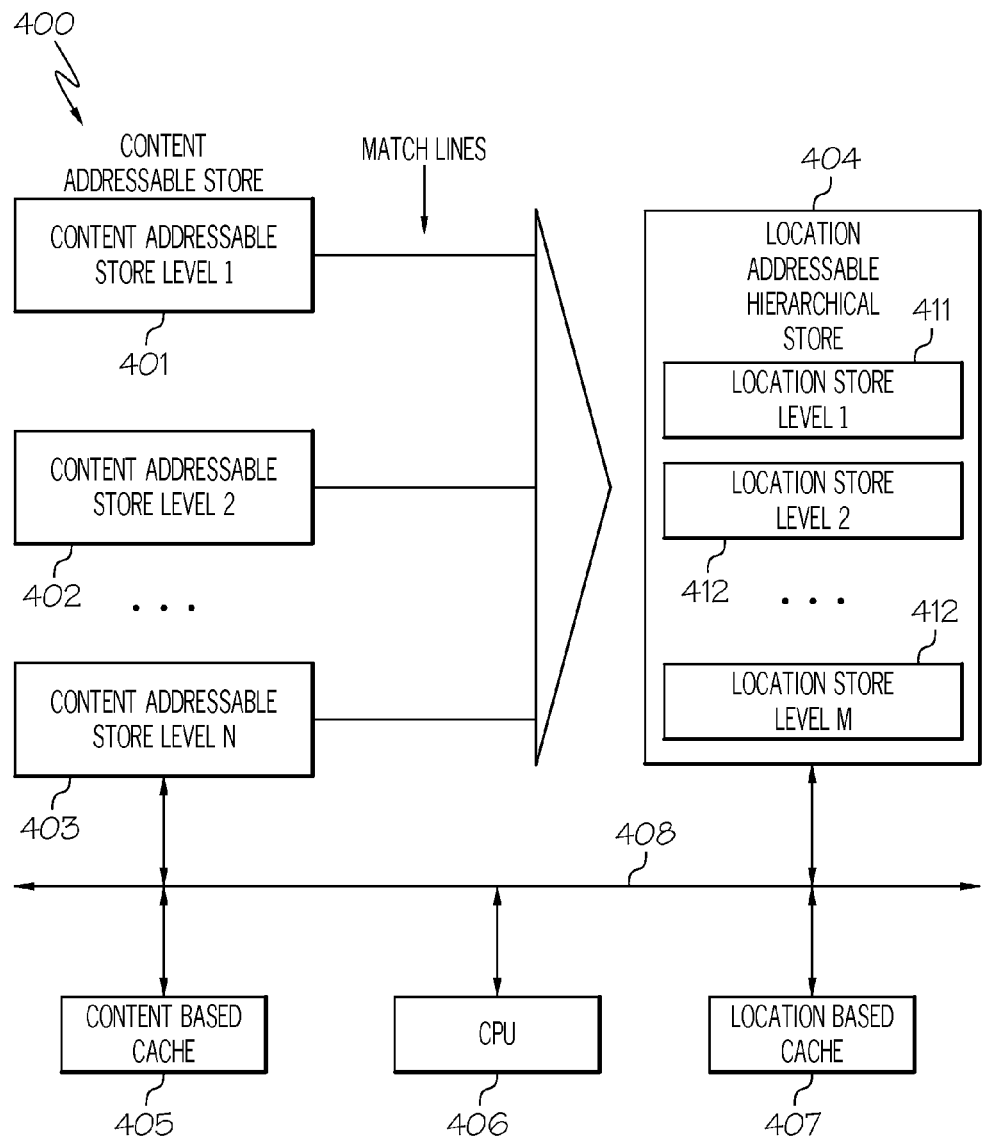
FIG. 4 is a block diagram illustrating am example content addressable memory system with multiple levels of stores, a content based cache, and a location based cache, in accordance with aspects of the invention.

FIG. 4 is a block diagram illustrating an example embodiment of a content addressable memory hierarchical system 400 that has multiple levels of content addressable stores 401-403, which may be utilized in one or more embodiments of the present invention. The content based memory system 400 is an example of a content memory hierarchy, which has been generalized to facilitate the description of the components and operation of the system. Each of the store levels 401-403 in the hierarchical content addressable system 400 may be implemented using hardware memory components, software, or a combination of hardware and software components. For example, a combined CAM-RAM content addressable memory system may store content words in ternary content addressable memory modules whose match lines are associated with corresponding pointers in RAM modules.

The combination of the various levels in a content addressable memory hierarchy enables system performance to be optimized based on desired performance, capacity and cost. The example embodiments of the content memory hierarchy move content words from lower levels to higher levels and vice-versa, based on demand and access frequency in a policy-dependent manner to take advantage of the performance and capacity benefits provided by each store level.

FIG. 4 further shows a system bus 408 through which the content addressable memory hierarchy 400 communicates with a CPU 406 and other components in the computer system. Location addressable store 404 also has multiple store levels 411-412 that contain data items associated with the content words in the content addressable hierarchy 400. A location addressable memory store level 411-412 is similar to a traditional memory where data is referenced by its memory address location. Addressing could be physical or virtual, and the location memory hierarchy could span multiple levels 411-412 of memory and secondary storage (e.g., disk storage).

When presented with a search word (which may have some bits masked out), the example content memory system of FIG. 4 retrieves matching content words and their corresponding data references from the content addressable memory hierarchy 400. Since multiple entries may match a search word, the content memory system 400 may return a stream of multiple results, which would require some kind of priority arbitration to be applied if a single result is desired. In addition, the content memory system 400 may create new content words to be added to the hierarchy as well as removing existing content words from the content stores as needed.

Content Based Cache and Location Based Cache

The example content memory system 400 shown in FIG. 4 includes a content based cache unit 405 and a location based cache unit 407 for improving the performance of the system. The caches 405 and 407 temporarily hold certain content words and data items, respectively, that have been retrieved from the content addressable store and location addressable store. The criteria for determining which content words and data items to be held in the caches 405 and 407 may be based, for example, on data that is recently-used or frequently-used in the system.

In the example embodiment of the invention in FIG. 4, the content based cache 405 contains <content word, offset range> tuples where an offset range indicates the address offset of a data item in the location addressable store that is referenced by the content word. If the data reference for a content word is already in the location based cache, then the content based cache refers to that data reference. Otherwise, the example memory system of the invention loads data associated with the content word into the location based cache 407 and points to the data from the content based cache. The system may maintain frequently accessed content word entries in the content based cache 405 to avoid additional processing associated with indexing overhead and ensure data consistency. Multiple matches to a content word are possible as there could be multiple entries for the same content word in the content memory system.

Prefetching a content word and storing it in the content cache 405 may be based on content locality rather than address locality. For a given content word, the illustrated embodiment of the invention may load data into the location based cache 407 in cache line size chunks (or smaller units if the data is less than cache line size), around a desired address offset. As an example, the illustrated content addressable memory hierarchy 400 may be implemented using a CAM-SRAM combination, effectively acting as a translation look-aside buffer for a virtual-physical address mapping in a computer system.

The location based cache 407 is provided for caching data from the location addressable store 404. Data in the location based cache 407 is directly indexed by a cache address and also associated with and searchable by a location address range. Further, a reference count that indicates the number of content words that point to the same data item may be used. The reference count is associated with each entry in the location based cache 407.

Content Page and Content Block

In the example embodiments of the invention as described, a content page is the results of a content word search that match a page size range in the content key space. The content key space is a collection of entries in a content addressable memory store whose content keys, such as map-key relationships, fall within a page range from each other where the range is page size aligned. For example, if the content key space is divided into 4-Kbyte pages, then the least significant 12 bits of the search word would be marked as "don't care" bits when the memory system retrieves a content page. The entries in a content page could be distributed across the content addressable memory store with no implied physical contiguity or ordering. These entries are part of a logical representation of a page, rather than a real memory page. A content page typically has empty areas within the page, i.e., sparse mapping. As a result, the physical size corresponding to a content page is usually smaller than a real memory page. In addition, since multiple entries may match the same content word, it is even for the physical size to be larger than a real memory page.

A content block is a group of content words that are consecutive in the content based address space, i.e., the content key space, and reference consecutive units of data in the location based address space. These consecutive entries in the content key space may be compressed into a single content block entry in the content memory if the range of content words can be represented as a ternary word. For example, consider an array of eight location data entries that are consecutive in the location address space and referenced by eight content words in the content address space. These content words can be combined into a single mapping, with the least significant three bits being marked as "don't care" bits, and the data references that point to these content words are labeled as a block with location units of size that match the array entry size.

As a further example, if the fifth element of the array is referenced by content, then the search word would map to a ternary block mapping, and the relative offset of the location where data is to be retrieved, i.e., 5 times unit size, can be calculated from the search word and the beginning of the ternary block. If the array is extended to four more elements, then the new elements can reside in a different location area with a new content word mapping created to cover the range of those four elements. Thus, if the tenth element is referenced by content, then the search word would match this new entry without additional referencing. This process enables a location based addressing to be supported in the memory system using one large ternary block mapping for the entire location range.

Content Addressable Memory Management Unit (CAMMU)

Figure 5:
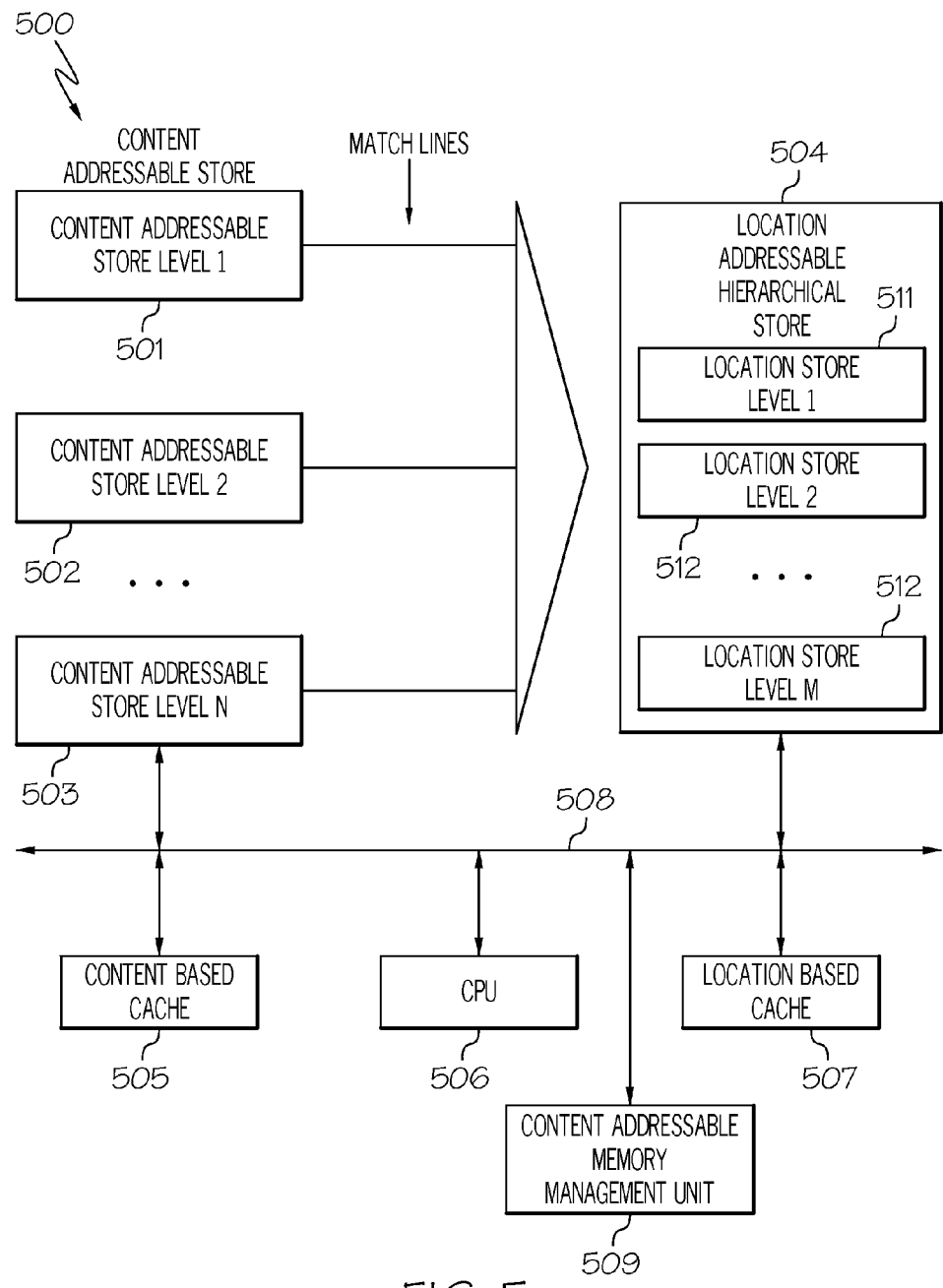
FIG. 5 is a block diagram of an example of a content memory system having a content addressable memory management (CAMMU) unit for managing content memory operations in the system, in accordance with aspects of the invention.

FIG. 5 depicts a block diagram of an example embodiment of a content addressable memory system of the invention that has a content addressable memory management (CAMMU) unit 509 for managing the operation of the memory system and providing virtual-physical address mapping in the system. Traditional notions of location based data paging and data blocks are replaced by content based paging and content blocks, which operate on a content key space instead of a location space. Similar to FIG. 4, the content addressable memory system 500 of FIG. 5 has multiple levels of content addressable stores 501-503, location addressable store hierarchy 504 with location store levels 511-512, content based cache 505, and location based cache 507. These components communicate with CPU 506 through system bus 508. The depicted system further includes the content addressable memory management (CAMMU) unit 509 for managing content pages and memory addressing operations. The content stores (memories) 501-503 may be embodied using hardware, software or a combination thereof depending on the desired performance versus efficiency tradeoff criteria.

The content memory system with a memory management unit, as shown in FIG. 5, allows for locality oriented optimizations and provides for address mapping schemes that can preserve location based addressing where desired, for example, as a default compatibility mode or where it is more efficient. It retains the benefits of spatial locality and location based addressing where preferable, while enabling the full power of content addressability at a system level. This is a much more flexible and powerful model than existing content addressable memory systems that have mainly been limited to specialized systems such as network routers.

Since the mapping from content based address to physical location can be as fine grained as a single memory word, the invention enables an extremely high level of flexibility in data organization from a software perspective, by shifting the responsibility for optimization to lower levels of the system where new systems techniques and emerging technologies could be deployed. This also enables fine grained copy-on-write operations on in-memory data structures. Middleware and system software may use these benefits to reduce the incidence of software run-time bloat at a systemic level. The use of a content memory system for eliminating run-time bloat is more desirable than current alternatives which tend to require significant efforts in redesigning software applications, as well as customizing solutions for specific applications.

Figure 6:
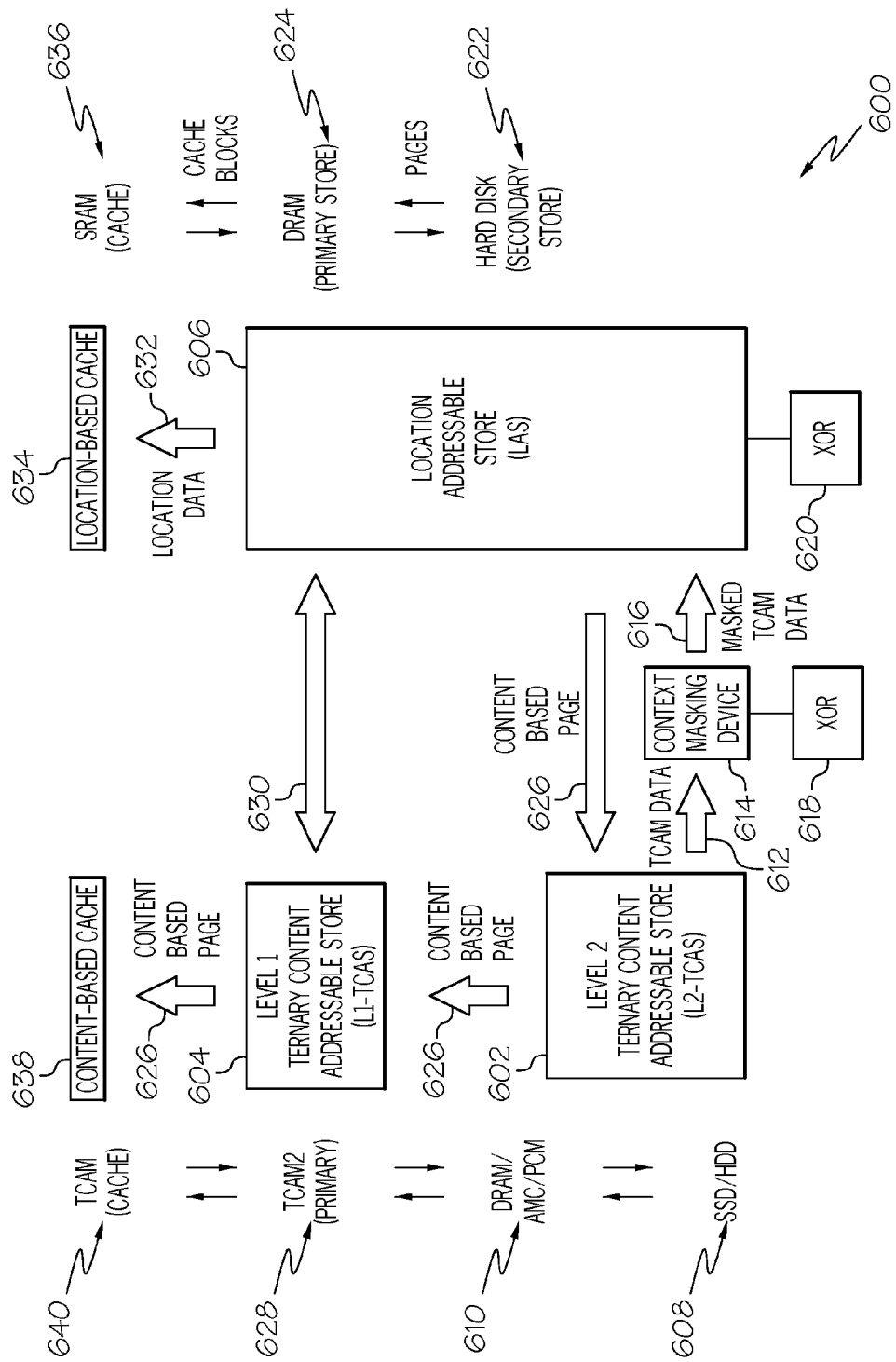
FIG. 6 depicts an overview of hardware used in accordance with one or more embodiments of the present invention.

With reference now to FIG. 6, an overview of further improvements to the systems described in FIGS. 2-5 are presented.

As shown in FIG. 6, the system 600 includes a Level 2 ternary content addressable store (L2-TCAS) 602 and a Level 1 TCAS (L1-TCAS) 604. L1-TCAS 604 and L2-TCAS 602 are able to locate files within Location Address Store 606 (similar to LAS 206 shown in FIG. 2) in a manner described above. However, in a preferred embodiment L2-TCAS 602 is implemented in software and L1-TCAS 604 is implemented in hardware. That is, L2-TCAS 602 executes hardware that accesses TCAM data from secondary storage 608 (e.g., a solid state drive—SSD or hard disk drive—HDD) or from a dynamic random access memory—DRAM 610, which is able to store compressed data (e.g., AMC) or uncompressed data (e.g., PCM). This TCAM data is retrieved as TCAM data 612.

Note further that the data stored in LAS 606 may be stored in a secondary store, such as a hard disk 622, and/or in a primary store, such as a dynamic random access memory (DRAM) 624.

In the embodiment depicted in FIG. 6, rather than directly sending the TCAM data 612 to the LAS 606 to search for data, the TCAM data 612 first goes to a context masking device 614. Context masking device 614 is a hardware chip that applies a bit mask to the TCAM data 612, in order to filter retrieved data from the LAS 606 according to desired context. Thus, context masking device 614 allows searches the fine tuned to look for data relevant to specific contexts (e.g., purpose, cost, age, etc.)

For example, assume that a particular piece data stored in the LAS 606 includes a content string (e.g., "011") that identifies it as being related to "dollars". In the CAM/TCAM system described in FIG. 2 above, this content string is all that is used to store/retrieve the desired data.

However in this embodiment, before the TCAM data 612 (e.g., "011" for "dollars") is sent to the LAS 606, it is masked with a context mask to generate a masked TCAM data 616, which is stored in the LAS 606. This masked TCAM data 616 not only identifies the associated content word (e.g., "dollars") but also the context mask (e.g., for "marketing"). That is, besides using the string "011" for "dollars" in the TCAM data 612, assume further that "100" is used as the context mask by context masking device 614 for "marketing", which provides the context for "marketing". An exclusive OR (XOR) 618 chip masks TCAM data 612 ("011") with the context mask ("100") to generate the string "111", which is now part of the masked TCAM data 616 that is used to store/retrieve in the LAS 606.

Subsequently, a user will request data related to "dollars" (content) and "marketing" (context) using the masked TCAM data 616 ("111"), such that any data within LAS 606 identified (i.e., having as part of the data block) with the masked TCAM data 616 is retrieved.

However, previously stored data in LAS 606 may not use the same TCAM data 612 and/or the same context mask used by context masking device 614. That is, rather than using the TCAM data for "dollars" (e.g., "011"), the previous data entry stored in the LAS 606 may have used the TCAM data for "money" (e.g., "010"). Similarly, rather than use the context mask for "marketing" (e.g., "100"), it may have used the context mask for "advertising" (e.g., "110"). In order to find related, if not exact matches, the LAS 606 uses XOR 620, which is a chip that determines the Hamming distance between masked TCAM data used to identify/locate data stored in the LAS 606.

XOR 620 (as well as XOR 618 discussed above) is hardware logic that compares two vectors (i.e., strings of characters), and then presents a total count of how many bits at particular bit locations are different. For example, the difference between "0101" and "1010" is derived by (0101) XOR (1010)=1111, such that each of the "1" values in "1111" indicate a bit that is different. Thus, the presence of four "1" bits in the string "1111" indicates that there are four bits that are different between "0101" and "1010". Similarly, the difference between "0101" and "0111" is derived by (0101) XOR (0111)=0010, indicating that only the bit at the third bit location in the two vectors is different (thus resulting in 1 "1" bit). These generated values (i.e., 4, 1) are known as "Hamming distances", which is defined as the total number of bit differences for all of the bit locations in a vector. Thus, the Hamming distance from "0101" to "1010" is 4; the Hamming distance from "0101" to "0111" is 1; the Hamming distance from "0101" to "0010" is 3; etc.

Note that it is not the total number of "1" s or "0" s in the initial strings that are counted. Rather, it is the total number of different bits at the same bit location within the two vectors that is counted. That is, "0101" and "1010" have the same number of "1" s (2), but the Hamming distance between these two vectors is still 4.

Thus, the Hamming distance between different masked TCAM data used to identify/locate the data stored in LAS 606 is used to determine how closely related the stored data are. That is, assume that a first masked TCAM data of "011" is used to store/identify a first data entry in LAS 606. Assume further that a second masked TCAM data of "001" is used to store/identify a second data entry in LAS 606. Finally, assume that a request for data identified by the masked TCAM data "010" is received. Since the Hamming distance between the TCAM data in the request and that used by the first data entry is 1 (010 XOR 011 shows one bit that is different), and the Hamming distance between the TCAM data in the request and that used by the second data entry is 2 (010 XOR 001 shows two bits that are different), then the first data entry is more closely related to the requested data than the second data entry. As such, the first data entry, but not the second data entry, will be returned if the maximum allowable Hamming distance has been predetermined to be 1.

Once the data identified within the predetermined Hamming distance is located, the related TCAM data are sent together in a content based page 626 to the L1-TCAS 604, either directly or via the L2-TCAS 602 as depicted. This allows the L1-TCAS 604, which can be stored in primary memory (RAM) shown as TCAM2 628, to retrieve the all related data (as indicated by arrow 630) from LAS 606 according to the masked TCAM data found in the content based page 626. That is, using the masked TCAM data from content based page 626, a processor (e.g., processor 104 shown in FIG. 1) is able to let the LAS 606 know which location data 632 to store in the location-based cache 634, which resides in a static random access memory (SRAM) 636.

Furthermore, the L1-TCAS 604 can send the content based page 626 to the content-based cache 638, which can reside in a TCAM cache 640. Thus, both the related TCAM data is available in the content-based cache 638, and the location addresses and/or the stored data itself is available in location-based cache 634. That is, in one embodiment location data 632 is the location of the data that is Hamming-distant related (according to the TCAM data). In one embodiment, location data 632 also includes the data itself, which is stored in the location-based cache 634.

Figure 7:
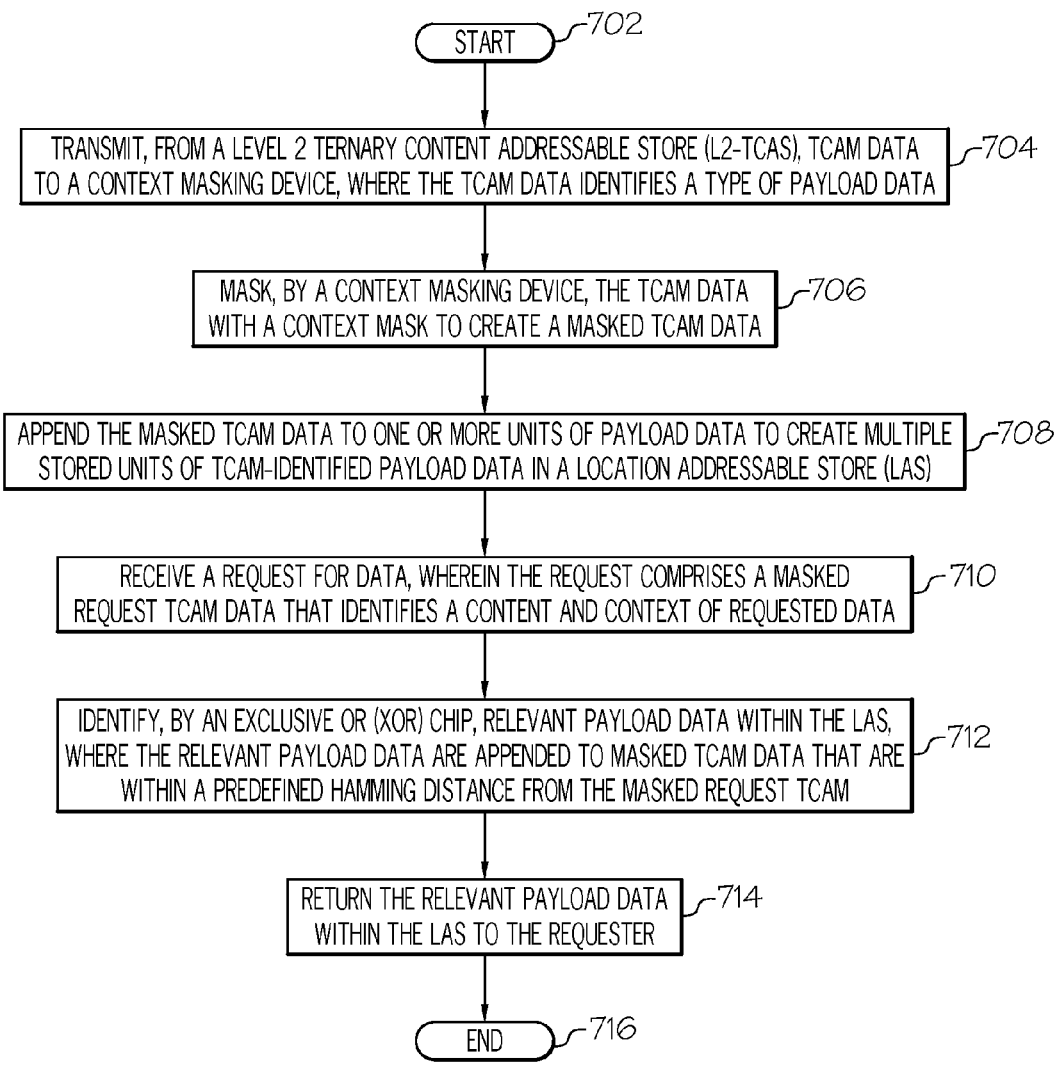
FIG. 7 is a high-level flow chart of one or more steps performed by one or more processors to retrieve and analyze stored data, according to one embodiment of the present invention.

With reference now to FIG. 7, a high-level flow chart of one or more operations performed by one or more processors and/or other hardware devices for storing and retrieving payload data using a ternary content addressed memory (TCAM) hybrid memory is presented.

After initiator block 702, TCAM data (e.g., TCAM data 612 shown in FIG. 6) is transmitted from a level 2 ternary content addressable store (L2-TCAS) (e.g., L2-TCAS 602 shown in FIG. 6) to a context masking device (e.g., context masking device 614 shown in FIG. 6), as described in block 704. As described herein, the TCAM data identifies a type of payload data, such as currency, temperature, census data, etc.

As described in block 706, the context masking device masks the TCAM data with a context mask to create a masked TCAM data (e.g., masked TCAM data 616 shown in FIG. 6.) The context mask identifies a context (e.g., marketing, sales, etc.) in which the type of payload data (e.g., dollars) is used. Thus, by masking the TCAM data with the context mask, the masked TCAM data identifies both the type of payload data and the context in which the type of payload data is used. That is, the TCAM data is "overlaid" with the context mask, such that the result can be interpreted to contain both the type of payload data and the context in which the type of payload data is used.

As described in block 708, one or more processors (e.g., processor 104 shown in FIG. 1) append the masked TCAM data to one or more units of payload data to create multiple stored units of TCAM-identified payload data in a location addressable store (LAS). That is, the masked TCAM data (which is a combination/masking of the TCAM data with the context mask) is then appended to payload data to create stored units of TCAM-identified payload data (e.g., the actual quantity of dollars used in the context of marketing).

As described in block 710, the processor(s) subsequently receive a request for data. This data includes a masked request TCAM data that identifies 1) a type of content/data (e.g., dollars) being requested and 2) a context of the data that is being requested.

As described in block 712, an exclusive OR (XOR) chip (e.g., XOR 620 shown in FIG. 6) identifies relevant payload data within the LAS, where the relevant payload data are appended to masked TCAM data that are within a predefined Hamming distance from the masked request TCAM. That is, the XOR chip compares the masked TCAM data that are appended to the multiple payload data in the LAS to the masked request TCAM data found in the data request in order to determine the Hamming distances between the request and the data in the LAS. As described herein, the payload data that is appended to the TCAM data that is similar enough (i.e., have appended TCAM data that are within a predefined Hamming distance to the TCAM data in the request) to the request are identified.

As described in block 714, the processor(s) then return the relevant payload data within the LAS to the requester.

The flow chart ends at terminator block 716.

In an embodiment of the present invention, the processor(s) combine the masked TCAM data that are within the predefined Hamming distance from the masked request TCAM into a content based page. That is, all TCAM data that are appended to payload data in the LAS are XORed, in order to determine how close they are to the TCAM data found in the data request. Those that are within a predefined Hamming distance are then consolidated into a content based page (e.g., content based page 626 shown in FIG. 6). The content based page is transmitted from the LAS to a level 2 TCAS (L2-TCAS) (e.g., L2-TCAS 602 shown in FIG. 6). As described herein, the L2-TCAS is a software-based logic that holds TCAM addresses for data stored in the LAS that are related to the request for data. The TCAM addresses are physically stored in a secondary storage (e.g., secondary storage 608 shown in FIG. 6). The processor(s) then store the content based page in the L2-TCAS, and return, to the requester, the relevant data within the LAS using the TCAM addresses in the content based page that is stored in the L2-TCAS.

In an embodiment of the present invention, the processor(s) combine the masked TCAM data that are within the predefined Hamming distance from the masked request TCAM into a content based page, and then transmit, from the LAS, the content based page to a level 1 TCAS (L1-TCAS) (e.g., L1-TCAS 604 shown in FIG. 6). As described herein, the L1-TCAS is hardware logic that holds TCAM addresses for data stored in the LAS that are related to the request for data. As such, there is no need to execute software (as in the L2-TCAS) to retrieve the TCAM data from storage. Rather, the L1-TCAS directly pulls the TCAM data from the TCAM2 628 shown in FIG. 6 using hardware circuitry.

Thus, the processors store the content based page in the L1-TCAS and return, to the requester, the relevant data within the LAS using the TCAM addresses in the content based page that is stored in the L1-TCAS.

In an embodiment of the present invention, the processor(s) transmit the content based page from the L1-TCAS to a content-based cache (e.g., content-based cache 638 shown in FIG. 6), which uses hardware that even faster than that used by L1-TCAS 604. This allows the system to return, to the requester, the relevant data within the LAS using the TCAM addresses in the content-based cache much faster.

In an embodiment of the present invention, the processor(s) identify logical addresses used in the LAS to locate the relevant data based on the masked TCAM data, and then store these identified logical addresses in a location-based cache (e.g., location-based cache 634 shown in FIG. 6). Thereafter, the processor(s) access the relevant data by using the logical addresses that are stored in the location-based cache, and return, to the requester, the relevant data within the LAS using the logical addresses in the location-based cache.

In an embodiment of the present invention, the processor(s) transmit the relevant payload data itself (not just the logical addresses) to the location-based cache, and then return, to the requester, the relevant data from the location-based cache.

In an embodiment of the present invention, the context of data being requested is from a group consisting of a purpose, a cost, and an age of the data being requested. Thus, the context mask allows the system to product requested data in a fine level of granularity.

In one or more embodiments, the present invention is implemented in a cloud environment. It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 8:
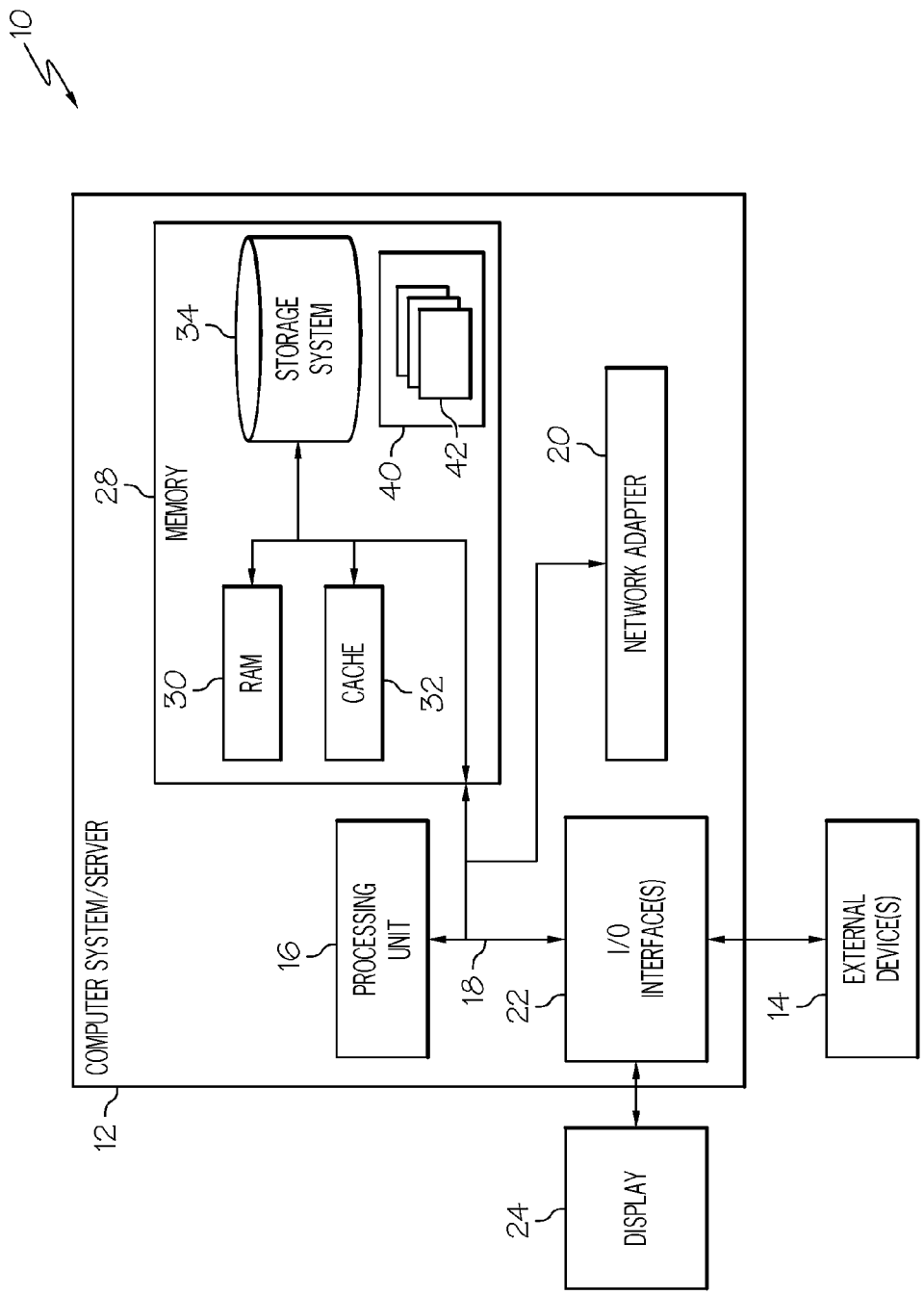
FIG. 8 depicts a cloud computing node according to an embodiment of the present disclosure.

Referring now to FIG. 8, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 8, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 9:
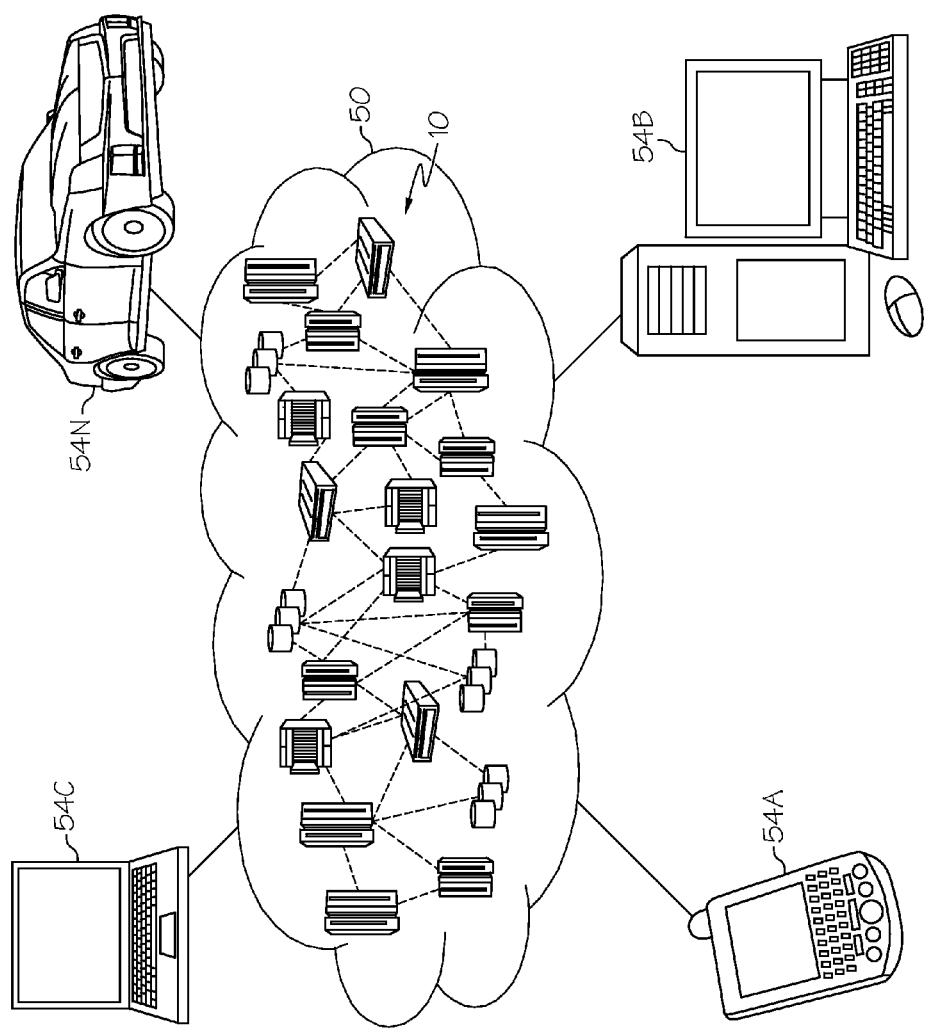
FIG. 9 depicts a cloud computing environment according to an embodiment of the present disclosure.

Referring now to FIG. 9, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices MA-N shown in FIG. 8 are intended to be illustrative only and that computing nodes 10 and cloud computing environment 50 can communicate with any type of computerized device over any type of network and/or network addressable connection (e.g., using a web browser).

Figure 10:
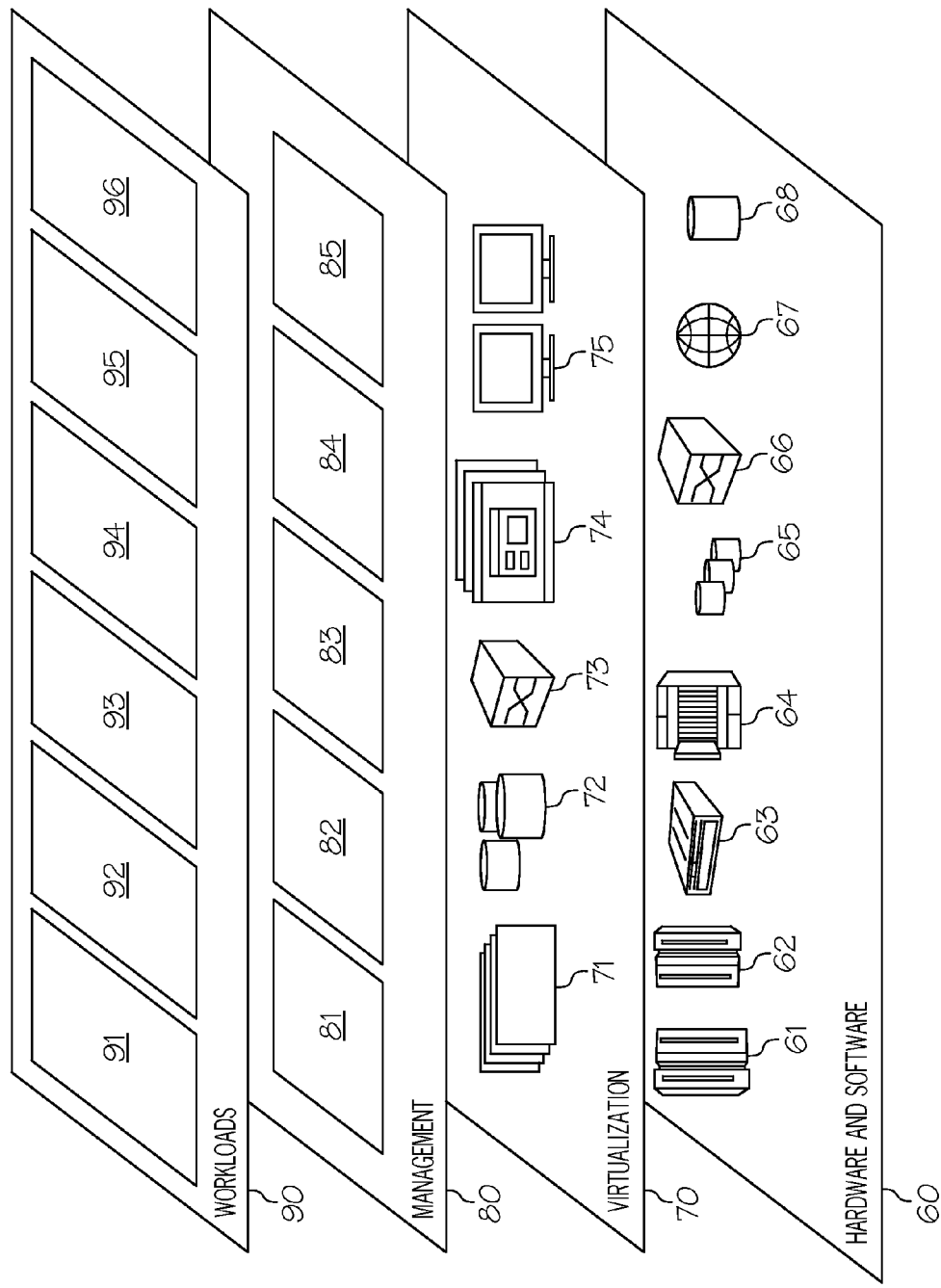
FIG. 10 depicts abstraction model layers according to an embodiment of the present disclosure.

Referring now to FIG. 10, a set of functional abstraction layers provided by cloud computing environment 50 (FIG. 9) is shown. It should be understood in advance that the components, layers, and functions shown in FIG. 10 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and payload data storing and retrieval processing 96 (for storing and retrieving payload data using a ternary content addressed memory (TCAM) hybrid memory as described herein).

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of various embodiments of the present invention has been presented for purposes of illustration and description, but is not intended to be exhaustive or limited to the present invention in the form disclosed. Many modifications and variations will be apparent to those of ordinary skill in the art without departing from the scope and spirit of the present invention. The embodiment was chosen and described in order to best explain the principles of the present invention and the practical application, and to enable others of ordinary skill in the art to understand the present invention for various embodiments with various modifications as are suited to the particular use contemplated.

Any methods described in the present disclosure may be implemented through the use of a VHDL (VHSIC Hardware Description Language) program and a VHDL chip. VHDL is an exemplary design-entry language for Field Programmable Gate Arrays (FPGAs), Application Specific Integrated Circuits (ASICs), and other similar electronic devices. Thus, any software-implemented method described herein may be emulated by a hardware-based VHDL program, which is then applied to a VHDL chip, such as a FPGA.

Having thus described embodiments of the present invention of the present application in detail and by reference to illustrative embodiments thereof, it will be apparent that modifications and variations are possible without departing from the scope of the present invention defined in the appended claims.

What is claimed is:

1. A method for storing and retrieving payload data using a ternary content addressed memory (TCAM) hybrid memory, the method comprising:

transmitting, from a level 2 ternary content addressable store (L2-TCAS), TCAM data to a context masking device, wherein the TCAM data identifies a type of payload data;

masking, by a context masking device, the TCAM data with a context mask to create a masked TCAM data, wherein the context mask identifies a context in which the type of payload data is used, and wherein the masked TCAM data identifies both the type of payload data and the context in which the type of payload data is used;

appending, by one or more processors, the masked TCAM data to one or more units of payload data to create multiple stored units of TCAM-identified payload data in a location addressable store (LAS);

receiving, by one or more processors, a request for data, wherein the request comprises a masked request TCAM data that identifies a data type and a context of data being requested;

identifying, by an exclusive OR (XOR) chip, relevant payload data within the LAS, wherein the relevant payload data are appended to masked TCAM data that are within a predefined Hamming distance from the masked request TCAM; and returning, to a requester, the relevant payload data within the LAS.

2. The method of claim 1, further comprising:

combining, by one or more processors, the masked TCAM data that are within the predefined Hamming distance from the masked request TCAM into a content based page;

transmitting, from the LAS, the content based page to a level 2 TCAS (L2-TCAS), wherein the L2-TCAS is a software-based logic that holds TCAM addresses for data stored in the LAS that are related to the request for data, wherein the TCAM addresses are stored in a secondary storage;

storing, by one or more processors, the content based page in the L2-TCAS; and returning, to the requester, the relevant data within the LAS using the TCAM addresses in the content based page that is stored in the L2-TCAS.

3. The method of claim 1, further comprising:
combining, by one or more processors, the masked TCAM data that are within the predefined Hamming distance from the masked request TCAM into a content based page;
transmitting, from the LAS, the content based page to a level 1 TCAS (L1-TCAS), wherein the L1-TCAS is hardware logic that holds TCAM addresses for data stored in the LAS that are related to the request for data;
storing, by one or more processors, the content based page in the L1-TCAS; and
returning, to the requester, the relevant data within the LAS using the TCAM addresses in the content based page that is stored in the L1-TCAS.

4. The method of claim 3, further comprising:
transmitting, by one or more processors, the content based page from the L1-TCAS to a content-based cache; and
returning, to the requester, the relevant data within the LAS using the TCAM addresses in the content-based cache.

5. The method of claim 1, further comprising:
identifying, by one or more processors, logical addresses used in the LAS for the relevant data based on the masked TCAM data;
storing, by one or more processors, the logical addresses used in the LAS for the relevant data in a location-based cache;
accessing, by one or more processors, the relevant data by using the logical addresses in the location-based cache; and
returning, to the requester, the relevant data within the LAS using the logical addresses in the location-based cache.

6. The method of claim 5, further comprising:
transmitting, by one or more processors, the relevant data to a location-based cache; and
returning, to the requester, the relevant data from the location-based cache.

7. The method of claim 1, wherein the context of data being requested is from a group consisting of a purpose, a cost, and an age of the data being requested.

8. A computer program product for storing and retrieving payload data using a ternary content addressed memory (TCAM) hybrid memory, the computer program product comprising a non-transitory computer readable storage medium having program code embodied therewith, the program code readable and executable by one or more processors to perform a method comprising:
transmitting, from a level 2 ternary content addressable store (L2-TCAS), TCAM data to a context masking device, wherein the TCAM data identifies a type of payload data;
masking, by a context masking device, the TCAM data with a context mask to create a masked TCAM data, wherein the context mask identifies a context in which the type of payload data is used, and wherein the masked TCAM data identifies both the type of payload data and the context in which the type of payload data is used;
appending the masked TCAM data to one or more units of payload data to create multiple stored units of TCAM-identified payload data in a location addressable store (LAS);
receiving a request for data, wherein the request comprises a masked request TCAM data that identifies a data type and a context of the data being requested;
identifying, by an exclusive OR (XOR) chip, relevant payload data within the LAS, wherein the relevant payload data are appended to masked TCAM data that are within a predefined Hamming distance from the masked request TCAM; and
returning, to a requester, the relevant payload data within the LAS.

9. The computer program product of claim 8, wherein the method further comprises:
combining the masked TCAM data that are within the predefined Hamming distance from the masked request TCAM into a content based page;
transmitting, from the LAS, the content based page to a level 2 TCAS (L2-TCAS), wherein the L2-TCAS is a software-based logic that holds TCAM addresses for data stored in the LAS that are related to the request for data, wherein the TCAM addresses are stored in a secondary storage;
storing the content based page in the L2-TCAS; and
returning, to the requester, the relevant data within the LAS using the TCAM addresses in the content based page that is stored in the L2-TCAS.

10. The computer program product of claim 8, wherein the method further comprises:
combining the masked TCAM data that are within the predefined Hamming distance from the masked request TCAM into a content based page;
transmitting, from the LAS, the content based page to a level 1 TCAS (L1-TCAS), wherein the L1-TCAS is hardware logic that holds TCAM addresses for data stored in the LAS that are related to the request for data;
storing the content based page in the L1-TCAS; and
returning, to the requester, the relevant data within the LAS using the TCAM addresses in the content based page that is stored in the L1-TCAS.

11. The computer program product of claim 10, wherein the method further comprises:
transmitting the content based page from the L1-TCAS to a content-based cache; and
returning, to the requester, the relevant data within the LAS using the TCAM addresses in the content-based cache.

12. The computer program product of claim 8, wherein the method further comprises:
identifying logical addresses used in the LAS for the relevant data based on the masked TCAM data;
storing the logical addresses used in the LAS for the relevant data in a location-based cache;
accessing the relevant data by using the logical addresses in the location-based cache; and
returning, to the requester, the relevant data within the LAS using the logical addresses in the location-based cache.

13. The computer program product of claim 12, wherein the method further comprises:
transmitting the relevant data to a location-based cache; and
returning, to the requester, the relevant data from the location-based cache.

14. The computer program product of claim 8, wherein the context of data being requested is from a group consisting of a purpose, a cost, and an age of the data being requested.

15. A computer system comprising:
a processor, a computer readable memory, and a non-transitory computer readable storage medium;
first program instructions to transmit, from a level 2 ternary content addressable store (L2-TCAS), ternary content addressed memory (TCAM) data to a context masking device, wherein the TCAM data identifies a type of payload data;
second program instructions to mask, by a context masking device, the TCAM data with a context mask to create a masked TCAM data, wherein the context mask identifies a context in which the type of payload data is used, and wherein the masked TCAM data identifies both the type of payload data and the context in which the type of payload data is used;
third program instructions to append the masked TCAM data to one or more units of payload data to create multiple stored units of TCAM-identified payload data in a location addressable store (LAS);
fourth program instructions to receive a request for data, wherein the request comprises a masked request TCAM data that identifies a data type and a context of data being requested;
fifth program instructions to identify, by an exclusive OR (XOR) chip, relevant payload data within the LAS, wherein the relevant payload data are appended to masked TCAM data that are within a predefined Hamming distance from the masked request TCAM; and
sixth program instructions to return, to a requester, the relevant payload data within the LAS; and wherein
the first, second, third, fourth, fifth, and sixth program instructions are stored on the computer readable storage medium and executed by the processor via the computer readable memory.

16. The computer system of claim 15, further comprising:
seventh program instructions to combine the masked TCAM data that are within the predefined Hamming distance from the masked request TCAM into a content based page;
eighth program instructions to transmit, from the LAS, the content based page to a level 2 TCAS (L2-TCAS), wherein the L2-TCAS is a software-based logic that holds TCAM addresses for data stored in the LAS that are related to the request for data, wherein the TCAM addresses are stored in a secondary storage;
ninth program instructions to store the content based page in the L2-TCAS; and
tenth program instructions to return, to the requester, the relevant data within the LAS using the TCAM addresses in the content based page that is stored in the L2-TCAS; and wherein the seventh, eighth, ninth, and tenth program instructions are stored on the computer readable storage medium and executed by the processor via the computer readable memory.

17. The computer system of claim 15, further comprising:
seventh program instructions to combine the masked TCAM data that are within the predefined Hamming distance from the masked request TCAM into a content based page;
eighth program instructions to transmit, from the LAS, the content based page to a level 1 TCAS (L1-TCAS), wherein the L1-TCAS is hardware logic that holds TCAM addresses for data stored in the LAS that are related to the request for data;
ninth program instructions to store the content based page in the L1-TCAS; and
tenth program instructions to return, to the requester, the relevant data within the LAS using the TCAM addresses in the content based page that is stored in the L1-TCAS; and wherein the seventh, eighth, ninth, and tenth program instructions are stored on the computer readable storage medium and executed by the processor via the computer readable memory.

18. The computer system of claim 17, further comprising:
eleventh program instructions to transmit the content based page from the L1-TCAS to a content-based cache; and
twelfth program instructions to return, to the requester, the relevant data within the LAS using the TCAM addresses in the content-based cache; and wherein
the eleventh and twelfth program instructions are stored on the computer readable storage medium and executed by the processor via the computer readable memory.

19. The computer system of claim 15, further comprising:
seventh program instructions to identify logical addresses used in the LAS by the relevant data based on the masked TCAM data;
eighth program instructions to store the logical addresses used in the LAS by the relevant data in a location-based cache;
ninth program instructions to access the relevant data by using the logical addresses in the location-based cache; and
tenth program instructions to return, to the requester, the relevant data within the LAS using the logical addresses in the location-based cache; and wherein
the seventh, eighth, ninth, and tenth program instructions are stored on the computer readable storage medium and executed by the processor via the computer readable memory.

20. The computer system of claim 15, wherein the context of data being requested is from a group consisting of a purpose, a cost, and an age of the data being requested.

* * * * *